United States Patent
Lo et al.

(10) Patent No.: US 9,640,242 B1
(45) Date of Patent: May 2, 2017

(54) SYSTEM AND METHOD FOR TEMPERATURE COMPENSATED REFRESH OF DYNAMIC RANDOM ACCESS MEMORY

(71) Applicant: QUALCOMM INCORPORATED, San Diego, CA (US)

(72) Inventors: Haw-Jing Lo, San Diego, CA (US); Dexter Tamio Chun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/956,565

(22) Filed: Dec. 2, 2015

(51) Int. Cl.
*G11C 11/34* (2006.01)
*G11C 11/406* (2006.01)
*G11C 11/4074* (2006.01)

(52) U.S. Cl.
CPC .... *G11C 11/40626* (2013.01); *G11C 11/4074* (2013.01); *G11C 11/40618* (2013.01)

(58) Field of Classification Search
CPC ........ G11C 11/40626; G11C 11/40615; G11C 7/04
USPC ..................... 365/174, 230.03, 211
See application file for complete search history.

(56) References Cited

U.S. PATENT DOCUMENTS

| | | | |
|---|---|---|---|
| 7,233,538 B1 | 6/2007 | Wu et al. | |
| 9,472,261 B1 * | 10/2016 | Chun | G11C 29/023 |
| 2013/0301371 A1 | 11/2013 | Chen | |
| 2016/0125921 A1 * | 5/2016 | Kambegawa | G11C 11/406 |
| | | | 711/106 |

OTHER PUBLICATIONS www.Micron.com, Title: "Mobile DRAM power-saving features and power calculations," Micron Technology 2005; Rev. B May 2009 EN, pp. No. 01-10.
Mohammadsadegh Sadri et al., "Energy optimization in 3D MPSoCs with wide-I/O DRAM using temperature variation aware bank-wise refresh," www.date-conference.com, 2014.
Menglong Guan et al., "Temperature aware refresh for DRAM performance improvement in 3D ICs," 16th International Symposium on Quality Electronic Design (ISQED), Mar. 2-4, 2015, Location: Santa Clara, CA.

* cited by examiner

*Primary Examiner* — Han Yang
(74) *Attorney, Agent, or Firm* — Smith Tempel

(57) ABSTRACT

Various embodiments of methods and systems for temperature compensated memory refresh ("TCMR") of a dynamic random access memory ("DRAM") component are disclosed. Embodiments of the solution leverage a memory refresh module located within a memory subsystem to apply a refresh power supply received from a source on the SoC. Advantageously, even though the refresh power supply is received from a source on the SoC according to a certain delivery rate that may not be optimal for each and every bank in the DRAM component, embodiments of the solution are able to apply an effective refresh power supply rate to each bank according to its optimal cycle.

14 Claims, 10 Drawing Sheets

LEGEND

Exemplary Memory
Refresh Scaling Factors:
1X, 0.5X, 0.25X

| Bank 0 | Bank 1 |
|--------|--------|
| Bank 2 | Bank 3 |

= Hotspot

Default Case

Exemplary Case 1A

Exemplary Case 1B

Exemplary Case 2

SYSTEM AND METHOD FOR TEMPERATURE COMPENSATED REFRESH OF DYNAMIC RANDOM ACCESS MEMORY

DESCRIPTION OF THE RELATED ART

Portable computing devices ("PCDs") are becoming necessities for people on personal and professional levels. These devices may include cellular telephones, portable digital assistants ("PDAs"), portable game consoles, palmtop computers, and other portable electronic devices. PCDs commonly contain integrated circuits, or systems on a chip ("SoC"), that include numerous components designed to work together to deliver functionality to a user. For example, a SoC may contain any number of master components that read and/or write data to and/or from memory components on the SoC. The read and write transactions work to instantiate data on a memory component, such as a dynamic random access memory ("DRAM") device, that must be refreshed periodically from power resources on the SoC in order to maintain the integrity of the data. Simply put, if the capacitors that comprise the DRAM device are allowed to "leak" their charge without being refreshed, the data stored in those capacitors will be lost.

DRAM devices commonly comprise banks of memory pages that may be refreshed either all at once ("all-bank refresh") or in sequence one after the other ("per-bank refresh"). In an all-bank refresh scheme, a single page in every bank of the DRAM is refreshed simultaneously, thereby making the entire DRAM unavailable for read/write transactions during the refresh period. Typically, the time to complete an all-bank refresh cycle is about 180 nanoseconds every 3.9 microsecond interval when the DRAM is at room temperature. By contrast, in a per-bank refresh scheme, a single page in a selected bank of the DRAM is refreshed, thereby making only the selected bank of the DRAM unavailable for read/write transactions during the refresh period. Typically, the time to complete a per-bank refresh cycle is about 90 nanoseconds every 3.9 microseconds divided by the number of banks. So, as one of ordinary skill in the art would understand, for a four bank DRAM that is refreshed on a per-bank refresh scheme, the refresh cycle across all four banks is approximately 360 nanoseconds every 3.9 microsecond interval.

Notably, the higher the temperature of the DRAM, the faster the capacitors of the DRAM drain and the more frequent the required refresh cycle interval. DRAM devices typically include internal temperature sensors, but have no way to provide actual temperature feedback to the SoC. Consequently, DRAM known in the art provides a temperature scaling factor (always a power of 2) back to the SoC which, in turn, uses the temperature scaling factor to determine an interval for provision of a power refresh command to the DRAM. For example, if the scaling factor is "1×," then the refresh cycle may be every 3.9 microseconds, whereas if the scaling factor is "0.5×," the refresh cycle may be approximately every 1.95 microseconds. Simply, the higher the DRAM temperature the lower the scaling factor in order to dictate a shorter time interval between refresh events.

Because an increased temperature in one memory bank of a DRAM device will dictate a lower scaling factor for the refresh power events to all banks of the DRAM, prior art methods are prone to refreshing memory banks of a DRAM device unnecessarily. Therefore, there is a need in the art for a system and method of temperature compensated refresh of DRAM that provides for efficient refresh of multiple memory banks associated with differing refresh power supply scaling factors.

SUMMARY OF THE DISCLOSURE

Various embodiments of methods and systems for temperature compensated memory refresh ("TCMR") of a dynamic random access memory ("DRAM") component are disclosed. Embodiments of the solution leverage a memory refresh module located within a memory subsystem to apply a refresh power supply received from a source on the SoC. Advantageously, even though the refresh power supply is received from a source on the SoC according to a certain delivery rate that may not be optimal for each and every bank in the DRAM component, embodiments of the solution are able to apply an effective refresh power supply rate to each bank according to its optimal cycle.

In an exemplary TCMR embodiment, a harmonic refresh approach comprises monitoring temperature associated with the multi-bank memory component. Depending on the embodiment, the monitored temperature(s) may be read from temperature sensors located within the memory subsystem and uniquely associated with the various banks that make up the memory component. In other embodiments, the monitored temperature may be derived from a combination of temperature sensor(s) located in the memory subsystem and temperature sensors located on the SoC but outside the memory subsystem. Regardless, the exemplary method may determine that the temperature has changed over a period of time and, based on the temperature, determine temperature scaling factors for each of the banks in the multi-bank memory component. Next, based on a fastest temperature scaling factor of the determined temperature scaling factors, the exemplary method may set a refresh power supply delivery rate to the multi-bank memory component from the SoC. Even so, the refresh power supply to each of the banks is provided according to the determined temperature scaling factors by "skipping" those banks during refresh cycles that do no require a refresh power supply in order to maintain data integrity.

In another exemplary TCMR embodiment, a fundamental refresh approach comprises monitoring temperature associated with the multi-bank memory component. Depending on the embodiment, the monitored temperature(s) may be read from temperature sensors located within the memory subsystem and uniquely associated with the various banks that make up the memory component. In other embodiments, the monitored temperature may be derived from a combination of temperature sensor(s) located in the memory subsystem and temperature sensors located on the SoC but outside the memory subsystem. Regardless, the exemplary method may determine that the temperature has changed over a period of time and, based on the temperature, determine temperature scaling factors for each of the banks in the multi-bank memory component. Next, based on a slowest temperature scaling factor of the determined temperature scaling factors, the exemplary method may set a refresh power supply delivery rate to the multi-bank memory component from the SoC. Even so, the refresh power supply to each of the banks is provided according to the determined temperature scaling factors by allowing multiple rows of certain banks to be refreshed on each cycle.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION

Figure 1:
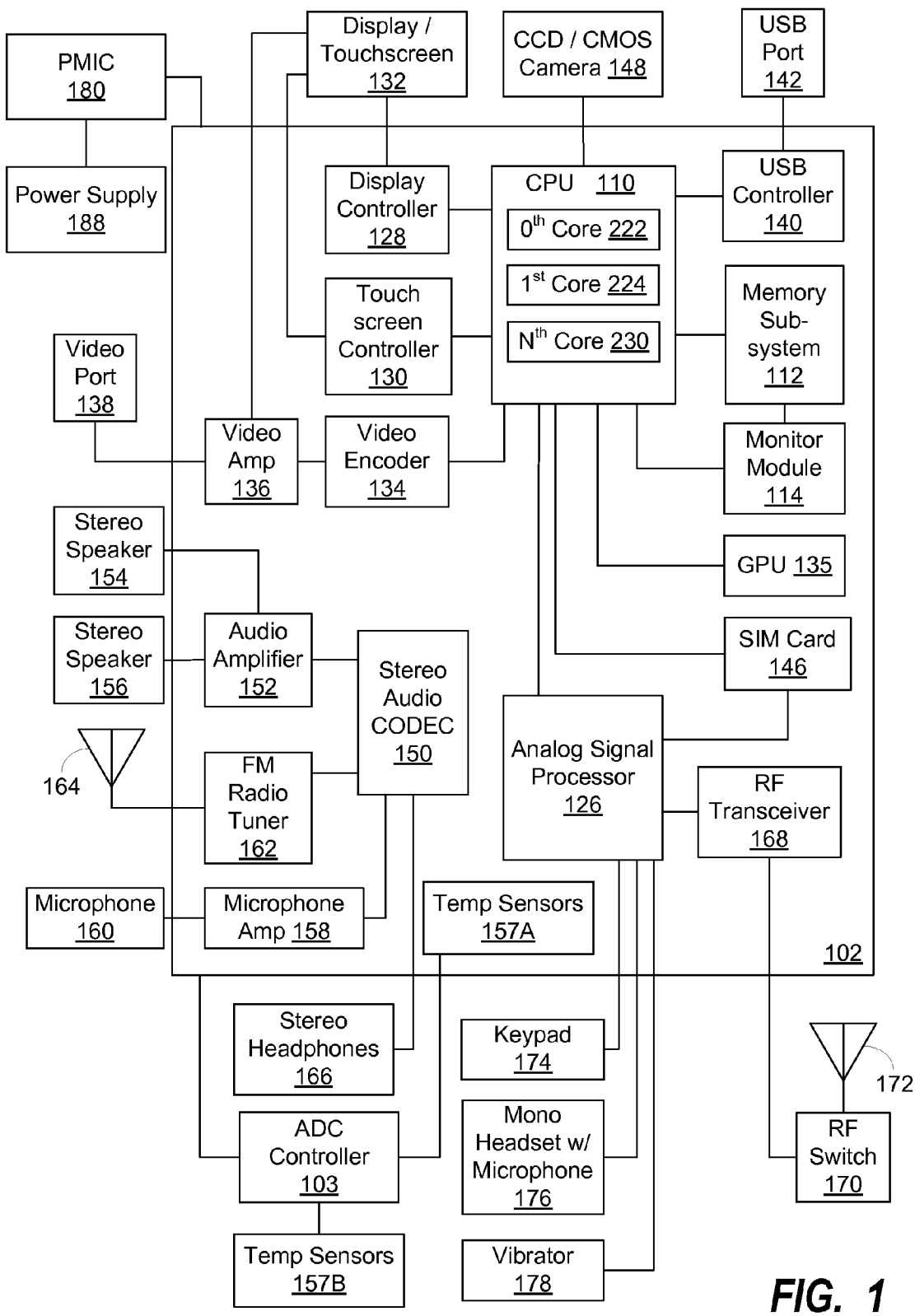
FIG. 1 is a functional block diagram illustrating an exemplary, non-limiting aspect of a portable computing device ("PCD") in the form of a wireless telephone for implementing temperature compensated memory refresh ("TCMR") systems and methods.

The word "exemplary" is used herein to mean serving as an example, instance, or illustration. Any aspect described herein as "exemplary" is not necessarily to be construed as exclusive, preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

In this description, reference to dynamic random access memory "DRAM" memory components will be understood to envision any of a broad class of volatile random access memory ("RAM") used for long term data storage and will not limit the scope of the solutions disclosed herein to a specific type or generation of RAM. As would be understood by one of ordinary skill in the art, DRAM works by storing charges in capacitors and using transistors as access switches to the charges. A given capacitor may either be charged or discharged (corresponding to a "1" or "0" as would be understood by one of ordinary skill in the art of binary). The charge held in a capacitor eventually "leaks," thus a DRAM memory component must be periodically refreshed with a power source in order to maintain the integrity of the data represented by the charges. At the time of this writing, the typical accepted value for how long it takes a DRAM capacitor to fully drain its charge is 64 milliseconds at "room temperature." As one of ordinary skill in the art would understand, a capacitor will leak its charge more quickly at temperatures higher than room temperature and will maintain its charge relatively longer than 64 milliseconds when the temperature is cooler than room temperature. Further, DRAM devices typically leverage an internal counter that iterates through the pages of the DRAM so that each page, or each group of pages, is refreshed in turn according to the refresh cycle.

Generally, DRAM memory devices support all-bank refresh schemes and/or per-bank refresh schemes. In this description, an all-bank refresh scheme envisions that upon provision of a refresh power supply to a DRAM device, a single page in every bank of the DRAM device is refreshed at the same time. As such, in an all-bank refresh scheme the entire DRAM device is unavailable for read/write transactions during the refresh cycle. By contrast, in this description, a per-bank refresh scheme envisions that upon provision of a refresh power supply to a DRAM device, a single page in a user-selected bank is refreshed, thereby making the selected bank unavailable for read/write transactions but leaving the other banks in the device accessible. When under an all-bank refresh scheme, the typical repeat cycle at the time of this writing for provision of the refresh power source may be approximately 3.9 microseconds, with a refresh event duration of around 180 nanoseconds. When under a per bank refresh scheme, the typical repeat cycle at the time of this writing for provision of the refresh power source may be approximately 3.9 microseconds divided by the number of banks in the memory, with a refresh event duration of around 90 nanoseconds. In the case of a 4-bank DRAM device, the total refresh time for a given cycle of 3.9 microseconds in an all-bank scheme is around 180 nanoseconds and the total refresh time for a given cycle in a per-bank scheme around 90 nanoseconds multiplied by the number of banks, resulting in 360 nanoseconds. As such, and as one of ordinary skill in the art would understand, the average time spent refreshing a page in an all-bank scheme may be significantly shorter than that which is experienced in a per-bank scheme.

As used in this description, the terms "component," "database," "module," "system," "controller," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "central processing unit ("CPU")," "digital signal processor ("DSP")," "graphical processing unit ("GPU")," and "chip" are used interchangeably. Moreover, a CPU, DSP, GPU or a chip may be comprised of one or more distinct processing components generally referred to herein as "core(s)."

In this description, the term "bus" refers to a collection of wires through which data and/or power is transmitted from a processing engine to a DRAM memory component or other device located on or off the SoC. As such, a bus may be used to periodically deliver a power supply to a DRAM device for the purpose of refreshing the capacitors and maintaining the integrity of the data represented therein.

In this description, the terms "refresh," "refresh cycle," and the like are used interchangeably to refer to the periodic provision of a power supply from the SoC to a given DRAM memory component. Based on the temperature of one or more banks in a given memory component, a refresh cycle may be adjusted according to a predetermined temperature scaling factor. By way of example, and not limitation, a 4-bank DRAM memory component operating at room temperature across all banks may receive a refresh power supply from the SoC every 3.9 microseconds based on a "1×" temperature scaling factor. The same 4-bank DRAM memory component, having experienced a rise in temperature associated with one or more of its banks, may receive a refresh power supply from the SoC according to a "0.5×" temperature scaling factor so that the refresh power supply is delivered every 1.95 microseconds (i.e., twice as often as when the 1× factor is applied).

In this description, the term "portable computing device" ("PCD") is used to describe any device operating on a limited capacity power supply, such as a battery. Although battery operated PCDs have been in use for decades, technological advances in rechargeable batteries coupled with the advent of third generation ("3G") and fourth generation ("4G") wireless technology have enabled numerous PCDs with multiple capabilities. Therefore, a PCD may be a cellular telephone, a satellite telephone, a pager, a PDA, a smartphone, a navigation device, a smartbook or reader, a media player, a combination of the aforementioned devices, a laptop computer with a wireless connection, among others.

In current systems and methods, temperature sensors internal to a DRAM device are used by the DRAM device to measure temperatures associated with one or more of its banks. Typically, however, the temperature measurements are not provided back to the SoC for adjustment of a refresh power supply delivery cycle. Rather, DRAM known in the prior art typically provides a temperature scaling factor (always in a power of two—e.g., 0.25×, 0.5×, 1×, 2×, 4×) back to the SoC so that the SoC may adjust the refresh power cycle in view of the scaling factor. Notably, because the selection of the scaling factor may be driven by only a particular bank that is experiencing thermal increases, prior art solutions are sub-optimal in their approach as they unnecessarily increase the rate of refresh for all banks in the DRAM even though all the banks may not require an increased refresh rate.

Advantageously, embodiments of temperature compensated memory refresh ("TCMR") solutions overcome the limitations of the prior art by employing a memory refresh module in the memory subsystem, i.e. on the DRAM itself, that is configured to optimize refresh cycle rates for each bank in the DRAM even though a SoC-based refresh module is delivering a refresh power supply according to a single temperature scaling factor.

FIG. 1 is a functional block diagram illustrating an exemplary, non-limiting aspect of a portable computing device ("PCD") in the form of a wireless telephone for implementing temperature compensated memory refresh ("TCMR") systems and methods. As shown, the PCD 100 includes an on-chip system 102 that includes a multi-core central processing unit ("CPU") 110 and an analog signal processor 126 that are coupled together. The CPU 110 may comprise a zeroth core 222, a first core 224, and an Nth core 230 as understood by one of ordinary skill in the art. Further, instead of a CPU 110, a digital signal processor ("DSP") may also be employed as understood by one of ordinary skill in the art.

In general, the memory subsystem 112 comprises, inter alia, a TCMR module 202 and a DRAM memory 115 (which may comprise separate memory chips, collectively depicted in the FIG. 1 illustration as memory subsystem 112). The memory subsystem 112 in general, and some of its components specifically, may be formed from hardware and/or firmware and may be responsible for optimizing refresh cycles in view of temperature measurements associated with banks of the DRAM 115. The temperature measurements may be monitored by the monitor module 114 and relayed to the TCMR module 202 in the memory subsystem 112. Advantageously, by controlling the refresh schemes from within the memory subsystem 112, embodiments of the solutions may optimize the refresh cycle for each bank even though a SoC-based memory refresh module may be supplying a refresh power supply based on a single temperature scaling factor that is not optimal for all banks in the DRAM 115. In this way, embodiments of the solution ensure data integrity across all banks without unnecessarily consuming refresh power from the SoC.

As illustrated in FIG. 1, a display controller 128 and a touch screen controller 130 are coupled to the digital signal processor 110. A touch screen display 132 external to the on-chip system 102 is coupled to the display controller 128 and the touch screen controller 130. PCD 100 may further include a video encoder 134, e.g., a phase-alternating line ("PAL") encoder, a sequential couleur avec memoire ("SECAM") encoder, a national television system(s) committee ("NTSC") encoder or any other type of video encoder 134. The video encoder 134 is coupled to the multi-core CPU 110. A video amplifier 136 is coupled to the video encoder 134 and the touch screen display 132. A video port 138 is coupled to the video amplifier 136.

As depicted in FIG. 1, a universal serial bus ("USB") controller 140 is coupled to the CPU 110. Also, a USB port 142 is coupled to the USB controller 140. The memory subsystem 112, which may include a PoP memory, a mask ROM/Boot ROM, a boot OTP memory, a DRAM memory 115 (see subsequent Figures) may also be coupled to the CPU 110 and/or include its own dedicated processor(s) and modules. A subscriber identity module ("SIM") card 146 may also be coupled to the CPU 110. Further, as shown in FIG. 1, a digital camera 148 may be coupled to the CPU 110. In an exemplary aspect, the digital camera 148 is a charge-coupled device ("CCD") camera or a complementary metal-oxide semiconductor ("CMOS") camera.

As further illustrated in FIG. 1, a stereo audio CODEC 150 may be coupled to the analog signal processor 126. Moreover, an audio amplifier 152 may be coupled to the stereo audio CODEC 150. In an exemplary aspect, a first stereo speaker 154 and a second stereo speaker 156 are coupled to the audio amplifier 152. FIG. 1 shows that a microphone amplifier 158 may be also coupled to the stereo audio CODEC 150. Additionally, a microphone 160 may be coupled to the microphone amplifier 158. In a particular aspect, a frequency modulation ("FM") radio tuner 162 may be coupled to the stereo audio CODEC 150. Also, an FM antenna 164 is coupled to the FM radio tuner 162. Further, stereo headphones 166 may be coupled to the stereo audio CODEC 150.

FIG. 1 further indicates that a radio frequency ("RF") transceiver 168 may be coupled to the analog signal processor 126. An RF switch 170 may be coupled to the RF transceiver 168 and an RF antenna 172. As shown in FIG. 1, a keypad 174 may be coupled to the analog signal processor 126. Also, a mono headset with a microphone 176 may be coupled to the analog signal processor 126. Further, a vibrator device 178 may be coupled to the analog signal processor 126. FIG. 1 also shows that a power supply 188, for example a battery, is coupled to the on-chip system 102 through a power management integrated circuit ("PMIC") 180. In a particular aspect, the power supply 188 includes a rechargeable DC battery or a DC power supply that is derived from an alternating current ("AC") to DC transformer that is connected to an AC power source.

The CPU 110 may also be coupled to one or more internal, on-chip thermal sensors 157A as well as one or more external, off-chip thermal sensors 157B. The on-chip thermal sensors 157A may reside on either the on-chip system 102 or the DRAM memory 115 and comprise one or more proportional to absolute temperature ("PTAT") temperature sensors that are based on vertical PNP structure and are usually dedicated to complementary metal oxide semiconductor ("CMOS") very large-scale integration ("VLSI") circuits. The off-chip thermal sensors 157B may comprise one or more thermistors. The thermal sensors 157 may produce a voltage drop that is converted to digital signals with an analog-to-digital converter ("ADC") controller (not shown). However, other types of thermal sensors 157 may be employed.

The touch screen display 132, the video port 138, the USB port 142, the camera 148, the first stereo speaker 154, the second stereo speaker 156, the microphone 160, the FM antenna 164, the stereo headphones 166, the RF switch 170, the RF antenna 172, the keypad 174, the mono headset 176, the vibrator 178, thermal sensors 157B, the PMIC 180 and the power supply 188 are external to the on-chip system 102. It will be understood, however, that one or more of these devices depicted as external to the on-chip system 102 in the exemplary embodiment of a PCD 100 in FIG. 1 may reside on chip 102 in other exemplary embodiments.

Figure 2:
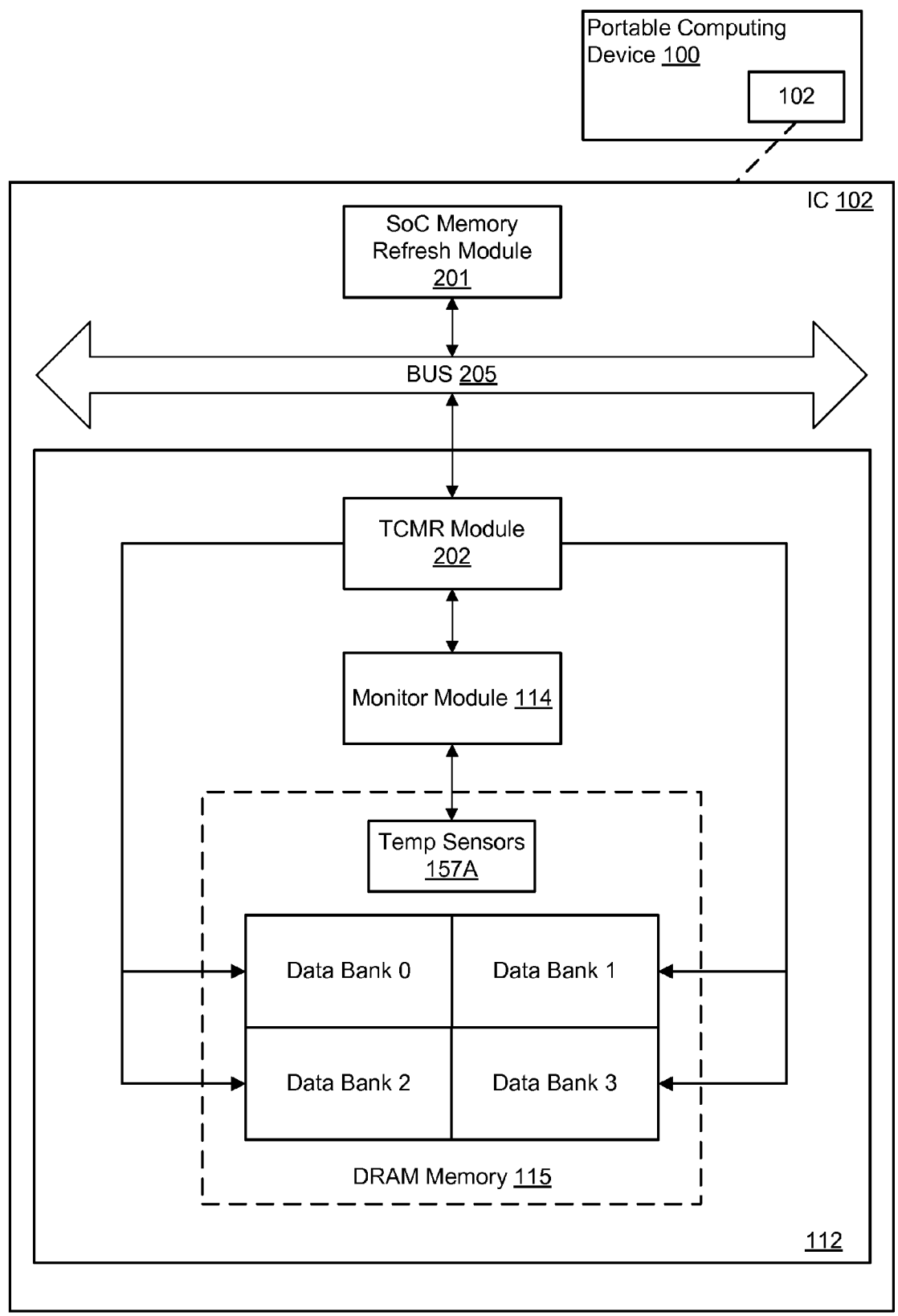
FIG. 2 is a functional block diagram illustrating an exemplary embodiment of an on-chip system for temperature compensated memory refresh ("TCMR") solutions.

In a particular aspect, one or more of the method steps described herein may be implemented by executable instructions and parameters stored in the memory subsystem 112 or as from the monitor module 114 and/or the TCMR module 202 (see FIG. 2). Further, the monitor module 114 and/or the TCMR module 202, the instructions stored therein, or a combination thereof may serve as a means for performing one or more of the method steps described herein.

FIG. 2 is a functional block diagram illustrating an exemplary embodiment of an on-chip system 102 for temperature compensated memory refresh ("TCMR") solutions. As can be seen in the FIG. 2 illustration, a SoC memory refresh module 201 works to supply a refresh power supply to the memory subsystem 112 via bus 205. As would be understood by one of ordinary skill in the art, the SoC memory refresh module 201 may supply the refresh power supply in view of a thermal scaling factor. A default thermal scaling factor may be represented as "1×," meaning that the refresh power supply is provided to the memory subsystem 112 at a rate associated with room temperature operation of the DRAM 115. In the event that the temperature scaling factor provided to the SoC memory refresh module 201 is reduced below "1×," such to "0.5×," the SoC memory refresh module 201 may increase the rate of providing the refresh power supply (i.e., reduce the amount of time allowed to elapse between provisions of the refresh power supply), as would be understood by one of ordinary skill in the art.

The temperature compensated memory refresh ("TCMR") module 202 resides within the memory subsystem 112 and works with the monitor module 114 to recognize temperature changes associated with the various banks of the DRAM 115. The monitor module 114, which may be comprised within the TCMR module 202 in some embodiments, monitors the temperature sensors 157A and reports the temperatures of the banks to the TCMR module 202. In turn, the TCMR module 202 may send notification to the SoC memory refresh module 201 to adjust the temperature scaling factor associated with delivery of the refresh power supply. Depending on embodiment, the TCMR module 202 may instruct the SoC memory refresh module 201 to provide the refresh power supply according to either a temperature scaling factor associated with a bank having the highest temperature reading or a temperature scaling factor associated with a bank having the lowest temperature reading.

Regardless of embodiment, the TCMR module 202 customizes a refresh cycle that optimizes the refresh power supply to each bank according to its individual optimal temperature scaling factor. That is, the refresh power supply from the SoC memory refresh module 201 may be supplied to the memory subsystem 112 according to a single temperature scaling factor, but the TCMR module 202 distributes the power to refresh the various banks of the DRAM 115 according to the temperature scaling factors most optimal for each bank. Exemplary TCMR cycles that may be dictated by a TCMR module 202 from within the memory subsystem 112 are described in more detail relative to the following figures.

Figure 3:
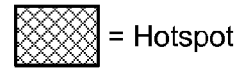
FIG. 3 is an illustration of exemplary thermal scaling factors that may be applicable to an exemplary 4-bank DRAM memory device under exemplary thermal cases.
Figure 3:
Figure 3:
Figure 3:

FIG. 3 is an illustration of exemplary thermal scaling factors that may be applicable to an exemplary 4-bank DRAM memory device under exemplary thermal cases. Exemplary aspects of exemplary embodiments of the solution will be depicted and described in subsequent figures in view of the thermal cases shown in the FIG. 3 illustration. At the top right of the FIG. 3 illustration, a legend indicates exemplary scaling factors, an exemplary bank layout for the 4-bank DRAM 115 depicted in the thermal cases, and a hatched shading meant to indicate a "hot spot" on one or more banks of a DRAM.

The default case illustrated in FIG. 3 may be interpreted as a DRAM 115 exhibiting room temperature level operating temperatures. As such, each bank in the default case may have a "1×" scaling factor associated with it. Because all banks in the default case have the same refresh cycle needs, a power supply from the SoC memory refresh module 201 may be set in view of a "1×" temperature scaling factor and the refresh power supply provided to all the banks according to that factor (e.g., every 3.9 microseconds).

The exemplary thermal cases 1A and 1B exhibit a hot spot contained within their respective banks 0. In thermal case 1A, the hotspot dictates that an optimal temperature scaling factor for the bank 0 may be 0.5× while the optimal scaling factor for its sister banks 1, 2 and 3 may remain at 1×. Notably, therefore, prior art methods require the SoC memory refresh module 201 in such a scenario to provide the refresh power supply to all of banks 0, 1, 2 and 3 according to the lower temperature scaling factor of 0.5× associated with bank 0. Otherwise, the data integrity of bank 0 may suffer due to excessive charge leakage. As such, the banks 1, 2 and 3 may be refreshed twice as often as needed just to make sure that bank 0 maintains data integrity. Embodiments of TCMR systems and methods provide a better solution to refresh cycles when optimal temperature scaling factors differ across sister banks in a DRAM device 115.

Similarly, in thermal case 1B, the hotspot dictates that an optimal temperature scaling factor for the bank 0 may be 0.75× while the optimal scaling factor for its sister banks 1, 2 and 3 may remain at 1×. Notably, therefore, prior art methods require the SoC memory refresh module 201 in such a scenario to provide the refresh power supply to all of banks 0, 1, 2 and 3 according to the lower temperature scaling factor of 0.75× associated with bank 0. Even so, because prior art methods are unable to accommodate temperature scaling factors that are not defined by a power of two, the refresh power supply to all of banks 0, 1, 2 and 3 may still have to be 0.5×, thereby refreshing all banks more frequently than required in order to maintain data integrity across all banks. Embodiments of TCMR systems and methods provide a better solution to refresh cycles when optimal temperature scaling factors across sister banks in a DRAM device 115 are not defined by a power of two.

Exemplary thermal case 2 exhibits a hot spot that adversely affects banks 0, 1 and 2 such that the optimal scaling factor for bank 0 is 0.25× while the optimal scaling factor for banks 1 and 2 is 0.5× and the optimal scaling factor for bank 3 is still 1× (bank 3 is unaffected by the hotspot). Notably, therefore, prior art methods require the SoC memory refresh module 201 in such a scenario to provide the refresh power supply to all of banks 0, 1, 2 and 3 according to the lower temperature scaling factor of 0.25× associated with bank 0. Otherwise, the data integrity of bank 0 may suffer due to excessive charge leakage. As such, the banks 1 and 2 may be refreshed twice as often as needed, and bank 3 refreshed four times as often as needed, just to make sure that bank 0 maintains data integrity. Embodiments of TCMR systems and methods provide a better solution to refresh cycles when optimal temperature scaling factors differ across sister banks in a DRAM device 115.

Figure 4A:
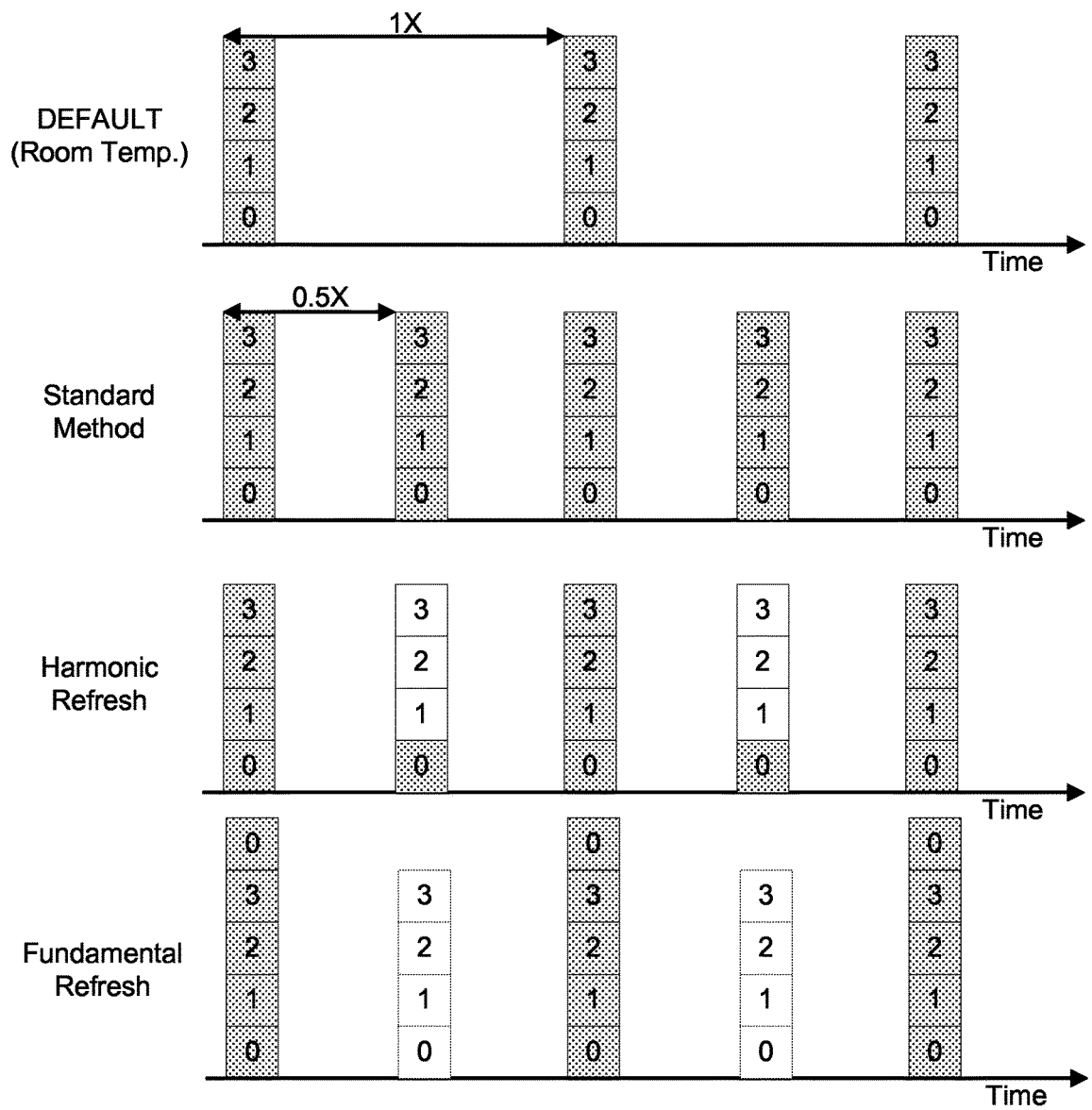
FIG. 4A is an illustration in view of the exemplary thermal case 1A illustrated in FIG. 3, the FIG. 4A illustration depicting bank refresh cycles according to certain embodiments of the solution for temperature compensated memory refresh ("TCMR")

FIG. 4A is an illustration in view of the exemplary thermal case 1A illustrated in FIG. 3, the FIG. 4A illustration depicting bank refresh cycles according to certain embodiments of the solution for temperature compensated memory refresh ("TCMR"). In the FIG. 4A illustration, exemplary thermal case 1A previously described relative to FIG. 3 is featured in the upper left corner. A legend is featured in the upper right corner. Also featured are four timelines illustrating a refresh cycle. The default refresh cycle illustrates how a 4-bank DRAM may be refreshed when the temperature across all the banks dictates a 1× temperature scaling factor. The default refresh cycle is offered as a baseline scenario in view of which the other illustrated refresh cycles may be better understood. As can be seen from the default refresh cycle timeline, each of banks 0, 1, 2 and 3 is refreshed at the same time. The gap between the successive columns represents a 1× temperature scaling factor.

Turning to the refresh cycle timeline associated with a standard method known in the art, under a thermal case consistent with exemplary thermal case 1A, the hotspot affecting bank 0 may dictate that the SoC memory refresh module 201 deliver a refresh power supply twice as often than the default setting. As such, it can be seen from the standard method timeline that each bank receives a power refresh twice as often even though banks 1, 2 and 3 only require a 1× temperature scaling factor.

Turning to the refresh cycle timeline associated with a novel harmonic refresh TCMR methodology, under the same exemplary thermal case 1A, a TCMR module 202 residing within the memory subsystem 112 may instruct the SoC memory refresh module 201 to deliver the refresh power supply based on the 0.5× temperature scaling factor of bank 0. Notably, however, and as can be understood from the illustration, the TCMR module 202 may only allow the bank 0 to receive the refresh power supply on every delivery cycle. In doing so, the TCMR module 202 may "skip" banks 1, 2 and 3 every other cycle, thereby effectively delivering a refresh power supply to banks, 1, 2 and 3 consistent with a 1× temperature scaling factor. In this way, the harmonic refresh TCMR solution provides power to each bank according to its optimum temperature scaling factor even though the SoC memory refresh module 201 is supplying the refresh power according to the fastest refresh rate indicated by the temperature scaling factor of the banks.

Turning to the refresh cycle timeline associated with a novel fundamental refresh TCMR methodology, under the same exemplary thermal case 1A, a TCMR module 202 residing within the memory subsystem 112 may instruct the SoC memory refresh module 201 to deliver the refresh power supply based on the 1× temperature scaling factor of banks 1, 2 and 3. Notably, to accommodate the fact that bank 0 requires refreshing twice as often as banks 1, 2 and 3, the TCMR module 202 may refresh twice as many pages in bank 0 as it does in the sister banks. In doing so, the TCMR module 202 may work to effectively deliver a refresh power supply to banks, 1, 2 and 3 consistent with a 1× temperature scaling factor while delivering a refresh power supply to the hotter bank 0 consistent with a 0.5× temperature scaling factor. In this way, the fundamental refresh TCMR solution provides power to each bank according to its optimum temperature scaling factor even though the SoC memory refresh module 201 is supplying the refresh power according to the slowest refresh rate indicated by the temperature scaling factor of the banks. Advantageously, the fundamental refresh TCMR methodology reduces the amount of refresh information conducted between the memory subsystem 112 and the SoC memory refresh module 201, permitting more time on bus 205 to be used for actual data traffic.

Figure 4B:
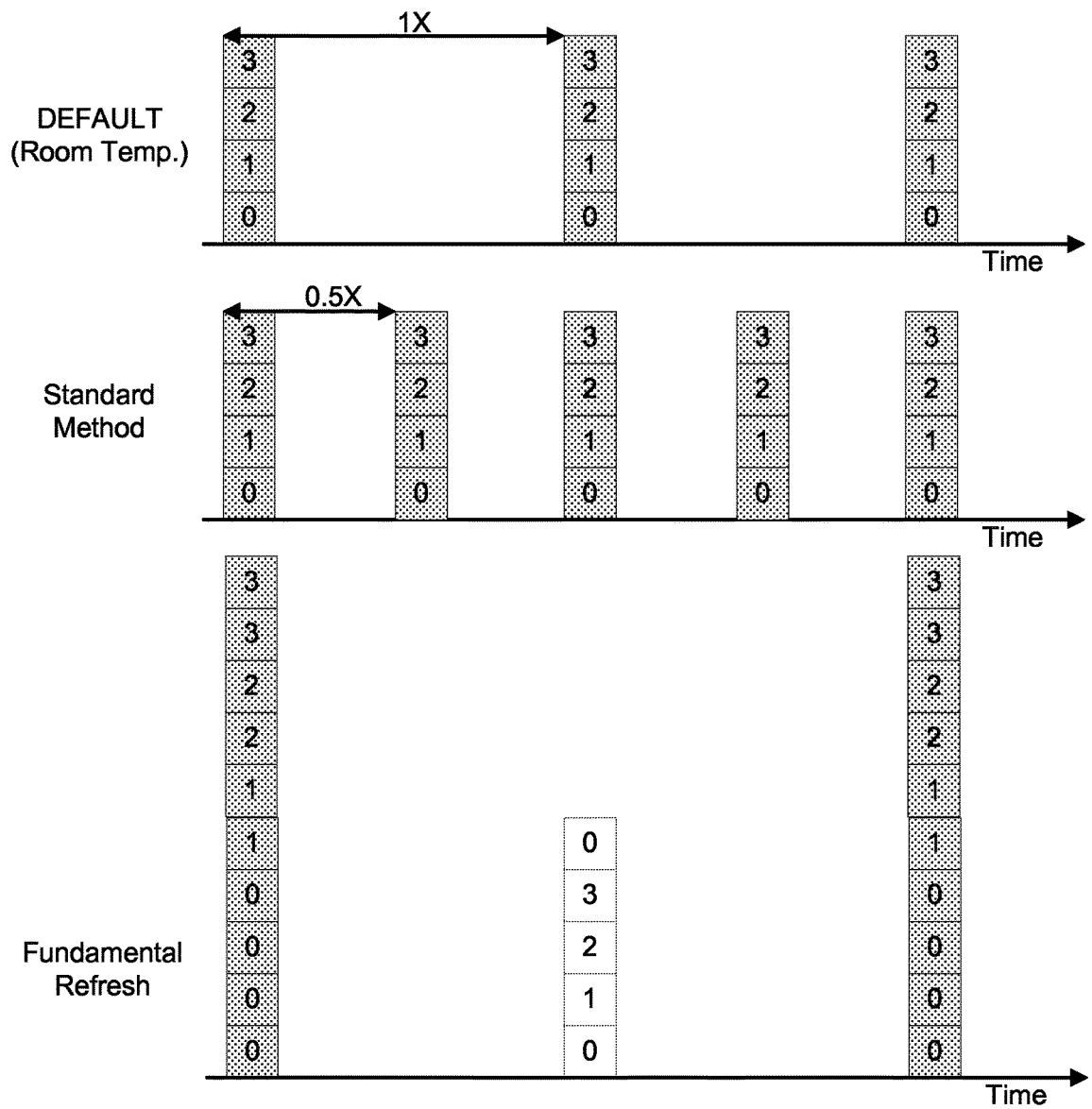
FIG. 4B is an illustration in view of the exemplary thermal case 1A illustrated in FIG. 3, the FIG. 4B illustration depicting bank refresh cycles according to certain additional embodiments of the solution for temperature compensated memory refresh ("TCMR")

FIG. 4B is an illustration in view of the exemplary thermal case 1A illustrated in FIG. 3, the FIG. 4B illustration depicting bank refresh cycles according to certain additional embodiments of the solution for temperature compensated memory refresh ("TCMR"). In the FIG. 4B illustration, exemplary thermal case 1A previously described relative to FIG. 3 is featured in the upper left corner. A legend is featured in the upper right corner. Also, like in FIG. 4A, the default refresh cycle is shown to illustrate how a 4-bank DRAM may be refreshed when the temperature across all the banks dictates a 1× temperature scaling factor. Further, like in FIG. 4A, the standard method refresh cycle is shown to illustrate how a standard method known in the art may react to the hotspot affecting bank 0 by dictating to the SoC memory refresh module 201 that a refresh power supply should be delivered twice as often than the default setting. The default refresh cycle and the standard method refresh cycles are offered as a baseline scenario in view of which the additional illustrated TCMR refresh cycles may be better understood. As can be seen from the default refresh cycle timeline, each of banks 0, 1, 2 and 3 is refreshed at the same time. The gap between the successive columns represents a 1× temperature scaling factor. As can be seen from the standard method refresh cycle, in response to exemplary thermal case 1A, each of banks 0, 1, 2 and 3 is refreshed according to the temperature scaling factor associated with bank 0 even though banks 1, 2 and 3 do not require refreshing as often as their sister bank 0.

Turning to the refresh cycle timeline in FIG. 4B that is associated with a novel fundamental refresh TCMR methodology, under the same exemplary thermal case 1A, a TCMR module 202 residing within the memory subsystem 112 may instruct the SoC memory refresh module 201 to deliver the refresh power supply based on a 2× temperature scaling factor (twice as slow as the 1× scaling factor of banks 1, 2 and 3). Notably, to accommodate the fact that bank 0 requires refreshing twice as often as banks 1, 2 and 3, and that banks 1, 2 and 3 require refreshing twice as often as the 2× scaling factor dictates, the TCMR module 202 may refresh on every power supply cycle four pages in bank 0 and two pages in each of the sister banks. In doing so, the TCMR module 202 may work to effectively deliver a refresh power supply to banks, 1, 2 and 3 consistent with a 1× temperature scaling factor while delivering a refresh power supply to the hotter bank 0 consistent with a 0.5× temperature scaling factor, even though the scaling factor used by the SoC memory refresh module 201 dictates a power supply delivery rate that is slower than the slowest rate associated with any of the banks.

Figure 4C:
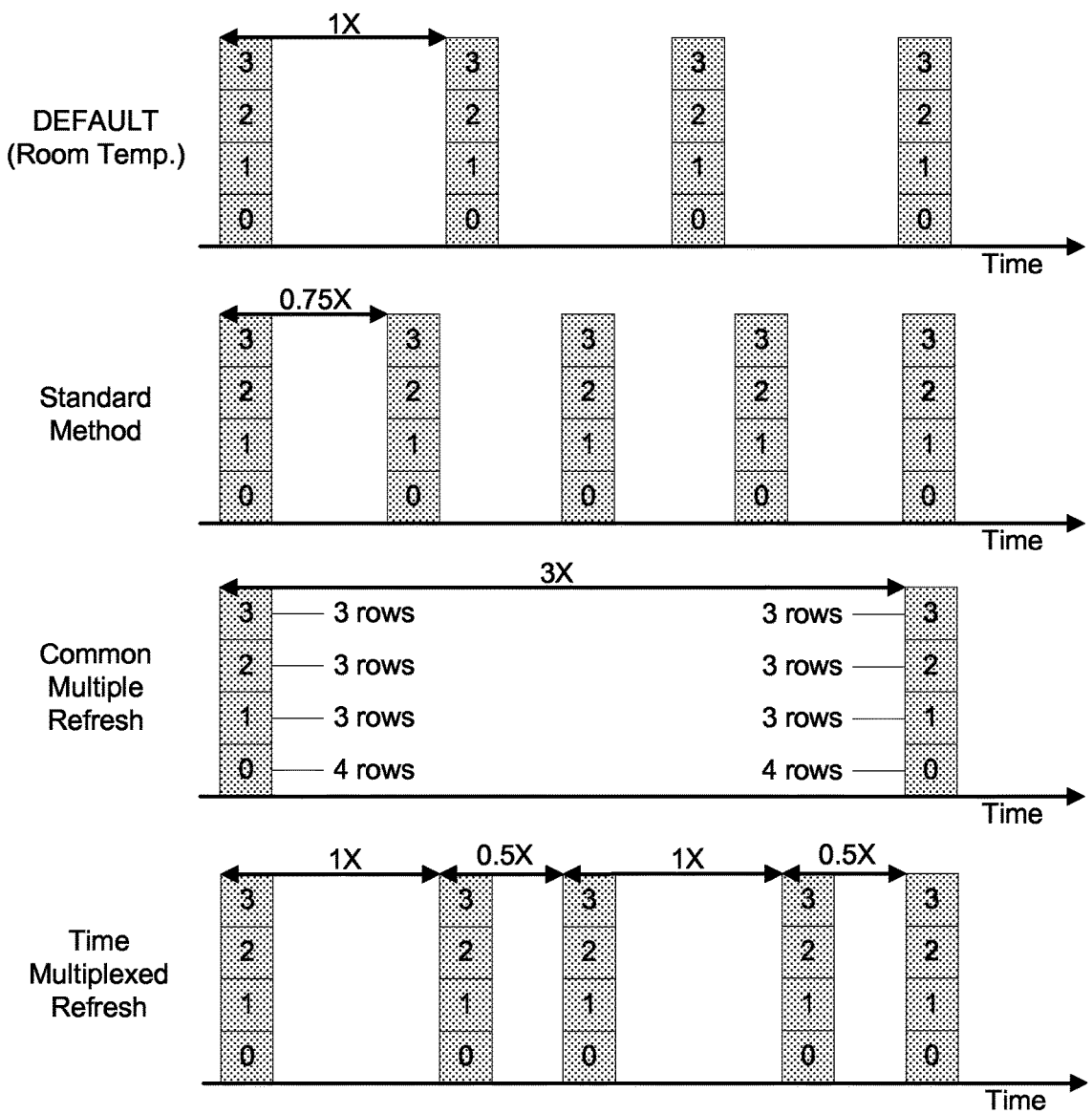
FIG. 4C is an illustration in view of the exemplary thermal case 1B illustrated in FIG. 3, the FIG. 4C illustration depicting bank refresh cycles according to certain additional embodiments of the solution for temperature compensated memory refresh ("TCMR")

FIG. 4C is an illustration in view of the exemplary thermal case 1B illustrated in FIG. 3, the FIG. 4C illustration depicting bank refresh cycles according to certain additional embodiments of the solution for temperature compensated memory refresh ("TCMR"). In the FIG. 4C illustration, exemplary thermal case 1B previously described relative to FIG. 3 is featured in the upper left corner. A legend is featured in the upper right corner. Also, the default refresh cycle is shown to illustrate how a 4-bank DRAM may be refreshed when the temperature across all the banks dictates a 1× temperature scaling factor. Further, the standard method refresh cycle is shown to illustrate how a standard method known in the art may seek to react to the hotspot affecting bank 0 by dictating to the SoC memory refresh module 201 that a refresh power supply should be delivered more often than the default setting. Notably, however, and as would be understood by one of ordinary skill in the art, even though the standard method may seek to provide a refresh power supply based on a 0.75× temperature scaling factor in response to a thermal case 1B, limitations of the prior art may dictate that the power supply refresh consistent with a 0.5× temperature scale (closest temperature scale that is a "power of two" from the default 1× temperature scale). For such reason, the standard method applied in response to a thermal case such as exemplary thermal case 1B, may provide a power supply per a refresh rate that is not optimal for any of the exemplary banks. Advantageously, the exemplary TCMR methodologies shown in the FIG. 4C illustration address the shortcomings of the standard method and prior art solutions.

The default refresh cycle and the standard method refresh cycles are offered as a baseline scenario in view of which the additional illustrated TCMR refresh cycles may be better understood. As can be seen from the default refresh cycle timeline, each of banks 0, 1, 2 and 3 is refreshed at the same time. The gap between the successive columns represents a 1× temperature scaling factor. As can be seen from the standard method refresh cycle, in response to exemplary thermal case 1B, each of banks 0, 1, 2 and 3 may be refreshed in view of the temperature scaling factor associated with bank 0 (0.75×) even though banks 1, 2 and 3 do not require refreshing as often as their sister bank 0.

Turning to the timeline in FIG. 4C representing an exemplary common multiple refresh TCMR methodology, the shortcomings of the prior art to optimize refresh power supply delivery in response to a thermal case such as exemplary thermal case 1B may be solved by embodiments of a TCMR solution using a common multiple approach. Using a common multiple approach, the TCMR module 202 may recognize that the temperature scaling factor associated with bank 0 is 0.75× and that the scaling factor associated with banks 1, 2 and 3 remain at 1×. Based on the two differing temperature scaling factors in the exemplary thermal case 1B, which each would dictate a different power supply refresh rate to the DRAM, the TCMR module 202 may calculate a common multiple that is an integer. For example, and as can be seen in the common multiple refresh timeline of FIG. 4C, the TCMR module 202 may recognize that a 3× temperature scaling factor is the lowest common multiple of the scaling rates of all the banks that is represented by an integer. Once calculated, the TCMR module 202 may determine that the power refresh supply should be delivered on a 3× temperature scaling factor and that for each cycle a full four pages/rows in bank 0 should be refreshed while three pages/rows are refreshed in each of banks 1, 2 and 3. In this way, the common multiple refresh TCMR methodology provides power to each bank consistent with its optimum temperature scaling factor even though the SoC memory refresh module 201 is supplying the refresh power according to a refresh rate that is, in the example, three times slower than the rate associated with the 1× temperature scaling factor of banks 1, 2 and 3.

Turning to the timeline in FIG. 4C representing an exemplary time multiplexed refresh TCMR methodology, the shortcomings of the prior art to optimize refresh power supply delivery in response to a thermal case such as exemplary thermal case 1B may be solved by embodiments of a TCMR solution using a time multiplexed approach. Using a time multiplexed approach, the TCMR module 202 may seek to average a rate of delivery of a refresh power supply across all the banks. As can be understood from the FIG. 4C example, the TCMR module 202 may instruct the SoC module 201 to deliver the refresh power supply according to a 0.5× rate and then allow refresh of all banks in an alternating cycle of 1× and 0.5× temperature scaling rates. In doing so, each of the banks would experience a refresh consistent with a rate dictated by the fastest 0.75× rate needed for bank 0. Even though banks 1, 2 and 3 would be refreshed more often than is absolutely necessary in order to maintain data integrity, their refresh rate would be more optimal than that experienced in the standard method and the refresh rate of the hotter bank 0 would be optimized.

Figure 5:
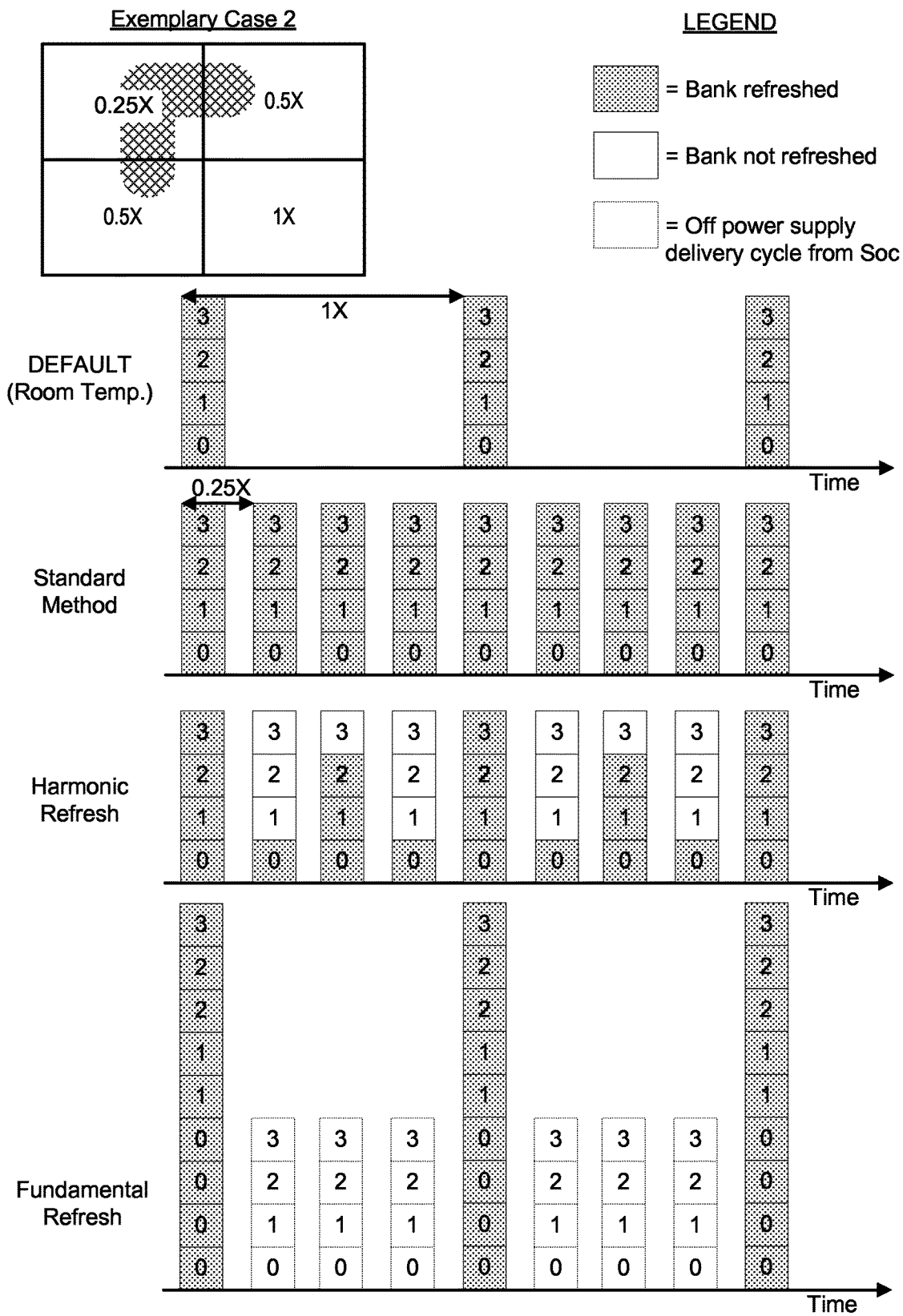
FIG. 5 is an illustration in view of the exemplary thermal case 2 illustrated in FIG. 3, the FIG. 5 illustration depicting bank refresh cycles according to certain embodiments of the solution for temperature compensated memory refresh ("TCMR")

FIG. 5 is an illustration in view of the exemplary thermal case 2 illustrated in FIG. 3, the FIG. 5 illustration depicting bank refresh cycles according to certain embodiments of the solution for temperature compensated memory refresh ("TCMR"). In the FIG. 5 illustration, exemplary thermal case 2 previously described relative to FIG. 3 is featured in the upper left corner. A legend is featured in the upper right corner. Also featured are four timelines illustrating a refresh cycle. The default refresh cycle illustrates how a 4-bank DRAM may be refreshed when the temperature across all the banks dictates a 1× temperature scaling factor. The default refresh cycle is offered as a baseline scenario in view of which the other illustrated refresh cycles may be better understood. As can be seen from the default refresh cycle timeline, each of banks 0, 1, 2 and 3 is refreshed at the same time. The gap between the successive columns represents a 1× temperature scaling factor.

Turning to the refresh cycle timeline associated with a standard method known in the art, under a thermal case consistent with exemplary thermal case 2, the hotspot affecting multiple banks 0, 1 and 2 may dictate that the SoC memory refresh module 201 deliver a refresh power supply four times as often than the default setting because bank 0 is associated with a 0.25× temperature scaling factor. As such, it can be seen from the standard method timeline that each bank receives a power refresh based on a worst case 0.25× scaling factor even though banks 1, 2 only require a 0.5× temperature scaling factor and bank 3 only requires a 1× temperature scaling factor. That is, prior art solutions that use the standard method in response to a thermal case such as exemplary thermal case 2 would refresh the exemplary banks 1 and 2 twice as often as needed and the exemplary bank 3 four times as often as needed in order to maintain data integrity.

Turning to the refresh cycle timeline associated with a novel harmonic refresh TCMR methodology, under the same exemplary thermal case 2, a TCMR module 202 residing within the memory subsystem 112 may instruct the SoC memory refresh module 201 to deliver the refresh power supply based on the 0.25× temperature scaling factor of bank 0. Notably, however, and as can be understood from the illustration, the TCMR module 202 may only allow the bank 0 to receive the refresh power supply on every delivery cycle. In doing so, the TCMR module 202 may "skip" banks 1 and 2 every other cycle and bank 3 for three cycles in a row, thereby effectively delivering a refresh power supply to banks 1 and 2 consistent with a 0.5× temperature scaling factor and bank 3 consistent with a 1× temperature scaling factor. In this way, the harmonic refresh TCMR solution provides power to each bank according to its optimum temperature scaling factor even though the SoC memory refresh module 201 is supplying the refresh power according to the fastest refresh rate indicated by the temperature scaling factor of the banks.

Turning to the refresh cycle timeline associated with a novel fundamental refresh TCMR methodology, under the same exemplary thermal case 2, a TCMR module 202 residing within the memory subsystem 112 may instruct the SoC memory refresh module 201 to deliver the refresh power supply based on the 1× temperature scaling factor of bank 3. Notably, to accommodate the fact that banks 0, 1 and 2 require refreshing more often than bank 3, the TCMR module 202 may refresh twice as many pages in banks 1 and 2, and four times as many pages in bank 0, as it does in bank 3. In doing so, the TCMR module 202 may work to effectively deliver a refresh power supply to bank 3 consistent with a 1× temperature scaling factor while delivering a refresh power supply to the hotter banks 0, 1 and 2 consistent with their 0.25× and 0.5× temperature scaling factors. In this way, the fundamental refresh TCMR solution provides power to each bank according to its optimum temperature scaling factor even though the SoC memory refresh module 201 is supplying the refresh power according to the slowest refresh rate indicated by the temperature scaling factor of the banks.

Figure 6:
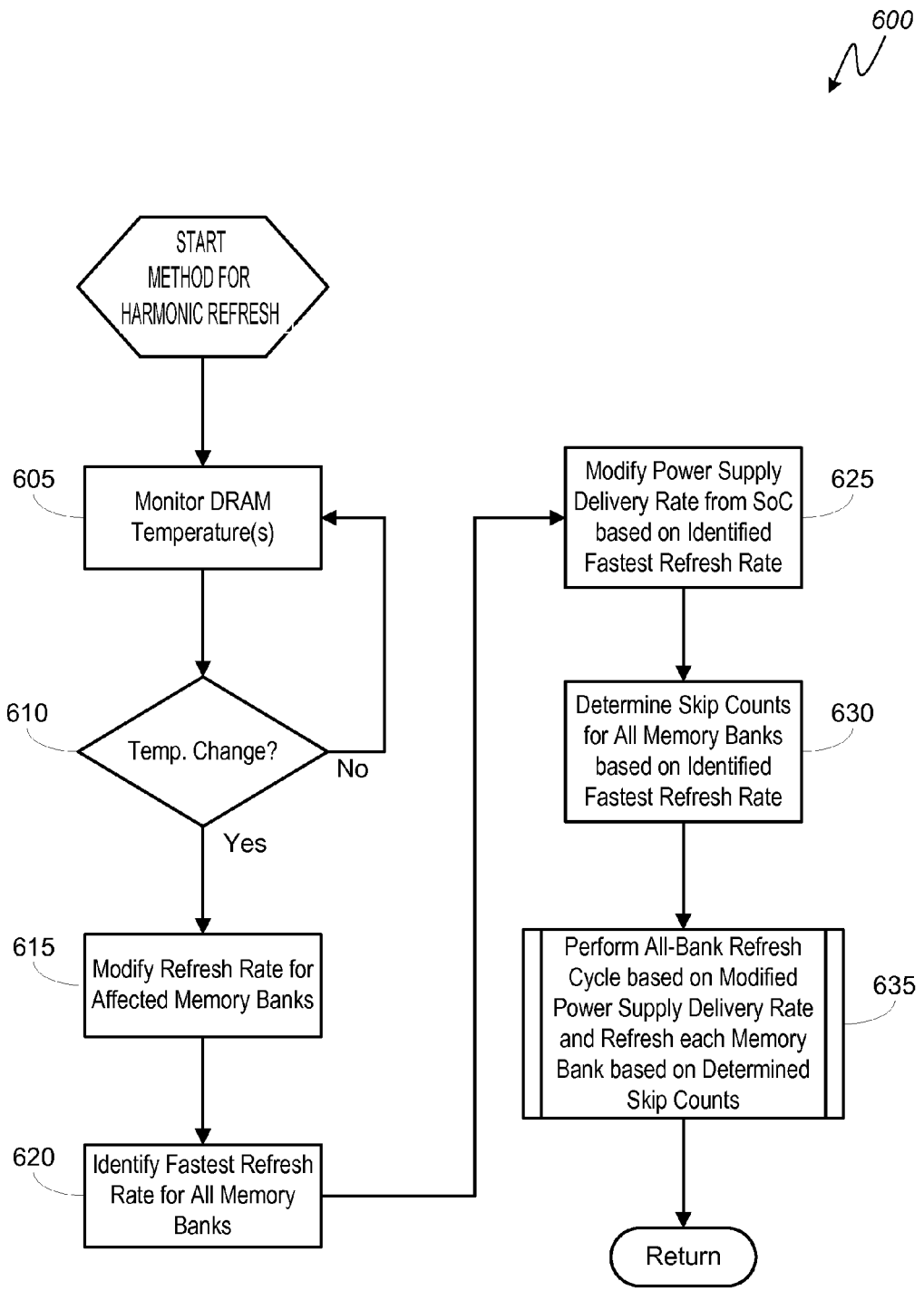
FIG. 6 is a logical flowchart illustrating an exemplary method for executing a harmonic refresh of a multi-bank DRAM according to an exemplary temperature compensated memory refresh ("TCMR") solution.

FIG. 6 is a logical flowchart illustrating an exemplary method 600 for executing a harmonic refresh of a multi-bank DRAM according to an exemplary temperature compensated memory refresh ("TCMR") solution. Beginning at block 605, temperatures of the various banks of the DRAM may be monitored. As would be understood by one of ordinary skill in the art, the temperature associated with any given bank of DRAM may dictate a temperature scaling factor that drives a minimum refresh rate required in order for the bank to maintain the integrity of its stored data.

Notably, although certain embodiments of TCMR solutions envision temperature sensors internal to a DRAM and geographically placed in order to determine temperatures of the various banks within, it is also envisioned that some TCMR solutions may be configured to work with a more economical DRAM having a single, low resolution temperature sensor. In such an application, it is envisioned that a TCMR solution may leverage temperature readings taken from other temperature sensors 157 located around the on-chip system 102. The temperature data collected from the SoC based temperature sensors 157 may be combined with the data collected from the DRAM temperature sensor(s) 157 to generate an approximate map of the temperature gradients within the DRAM. Gradients may be computed using simple interpolation, or may be more complex and implemented using a look-up table of pre-computed values based on empirical measurement. Further, it is envisioned that data taken from a SoC based temperature sensor(s) 157 may be combined with monitoring the volume of data traffic flowing to physical memory address ranges (corresponding to geographical banks) to include effects of self-heating within the DRAM, i.e. the TCMR module 202 detecting a high volume of data traffic flowing across bus 205 to/from the physical addresses that correspond to a first bank may be used to infer a temperature increase within the DRAM for the first bank; this can again be pre-computed based on empirical measurement. The computed "temperature map" may be communicated from the SoC memory refresh module 201 to the TCMR module 202 (may be stored in a portion of memory 112 in a database not shown in the figures) and used in lieu of temperature measurements taken from the DRAM only to implement one or more of the exemplary TCMR solutions described herein.

Returning to the method 600, at block 610 the monitor module 114 may determine whether there has been a temperature change associated with one or more of the DRAM banks. If there has been no temperature change, then the "no" branch is followed from decision block 610 back to block 605 and temperature monitoring continues. With no temperature change recognized, the TCMR module 202 may continue to apply a current TCMR approach without adjustment. If the monitor module 114 recognizes a change in temperature of one or more of the banks, the "yes" branch is followed to block 615 and the TCMR module 202 may modify refresh rates (i.e., temperature scaling factors) associated with one or more banks.

At block 620, the TCMR module 202 may identify the fastest refresh rate required by the various banks (i.e., it may determine the lowest temperature scaling factor). Based on the identified fastest refresh rate, at block 625 of the method 600 the TCMR module 202 may modify the refresh power supply delivery rate coming from the SoC. Next, at block 630, using the temperature scaling factors of all the banks, the TCMR module 202 may determine, based on the newly modified refresh power supply delivery rate, a pattern of "skipping" certain banks on certain refresh cycles. Once the "skip" pattern is determined by the TCMR module 202, the TCMR module 202 may proceed at routine block 635 to apply the refresh power supply to the banks based on the skip counts. In this way, the TCMR harmonic refresh method 600 may optimize refresh power supply delivery to each bank based on each bank's optimal temperature scaling factor. The method 600 returns.

Figure 7:
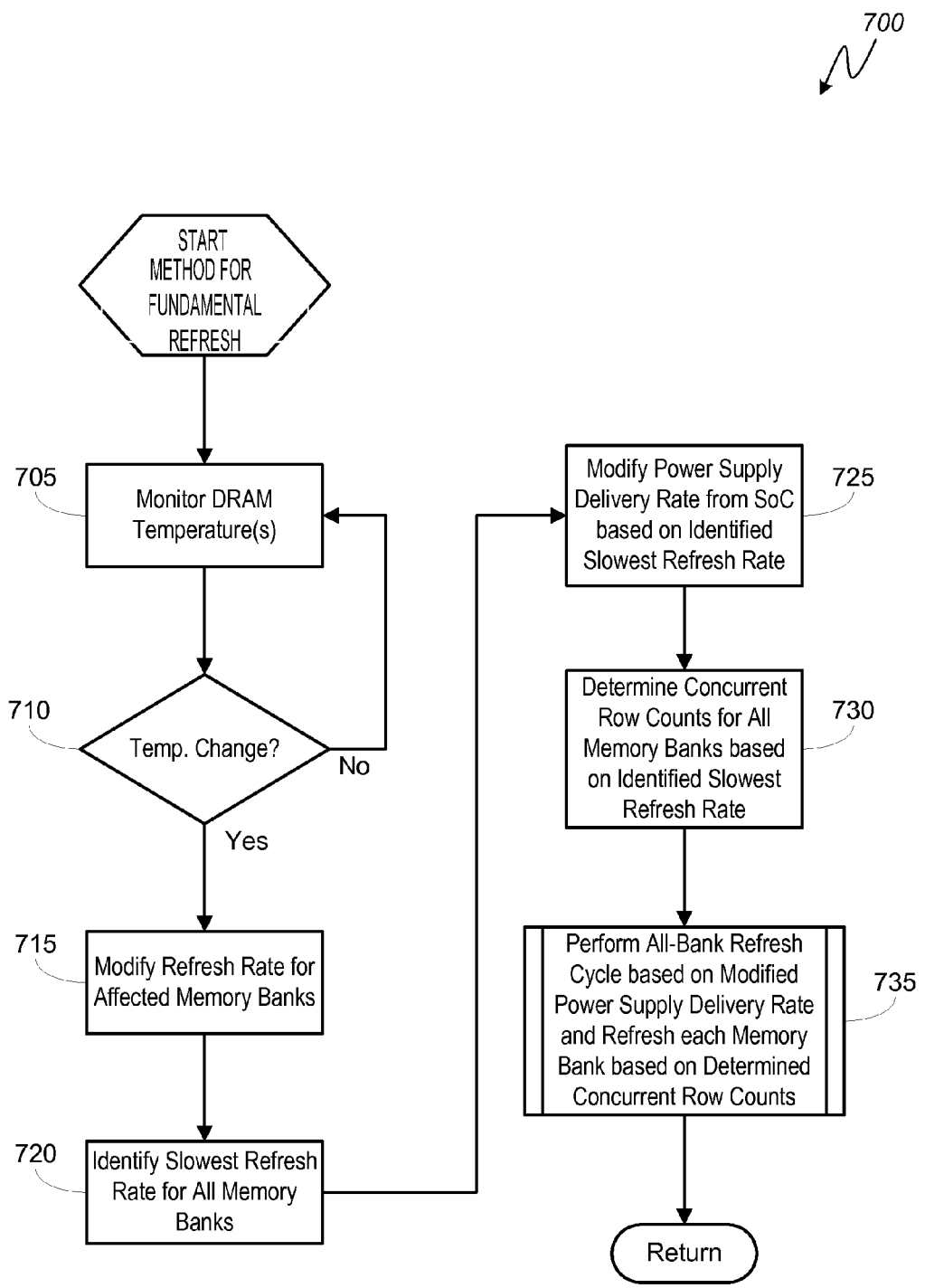
FIG. 7 is a logical flowchart illustrating an exemplary method for executing a fundamental refresh of a multi-bank DRAM according to an exemplary temperature compensated memory refresh ("TCMR") solution.

FIG. 7 is a logical flowchart illustrating an exemplary method 700 for executing a fundamental refresh of a multi-bank DRAM according to an exemplary temperature compensated memory refresh ("TCMR") solution. Beginning at block 705, temperatures of the various banks of the DRAM may be monitored. As would be understood by one of ordinary skill in the art, the temperature associated with any given bank of DRAM may dictate a temperature scaling factor that drives a minimum refresh rate required in order for the bank to maintain the integrity of its stored data.

Returning to the method 700, at block 710 the monitor module 114 may determine whether there has been a temperature change associated with one or more of the DRAM banks. If there has been no temperature change, then the "no" branch is followed from decision block 710 back to block 705 and temperature monitoring continues. With no temperature change recognized, the TCMR module 202 may continue to apply a current TCMR approach without adjustment. If the monitor module 114 recognizes a change in temperature of one or more of the banks, the "yes" branch is followed to block 715 and the TCMR module 202 may modify refresh rates (i.e., temperature scaling factors) associated with one or more banks.

At block 720, the TCMR module 202 may identify the slowest refresh rate required by the various banks (i.e., it may determine the highest temperature scaling factor). Based on the identified slowest refresh rate, at block 725 of the method 700 the TCMR module 202 may modify the refresh power supply delivery rate coming from the SoC. Next, at block 730, using the temperature scaling factors of all the banks, the TCMR module 202 may determine, based on the newly modified refresh power supply delivery rate, concurrent page or row counts that must be refreshed each cycle for each bank in order to maintain data integrity. Once the concurrent page count for each bank is determined by the TCMR module 202, the TCMR module 202 may proceed at routine block 735 to apply the refresh power supply on each cycle to the determined number of rows for each bank. In this way, the TCMR fundamental refresh method 700 may optimize refresh power supply delivery to each bank based on each bank's optimal temperature scaling factor. The method 700 returns.

Figure 8:
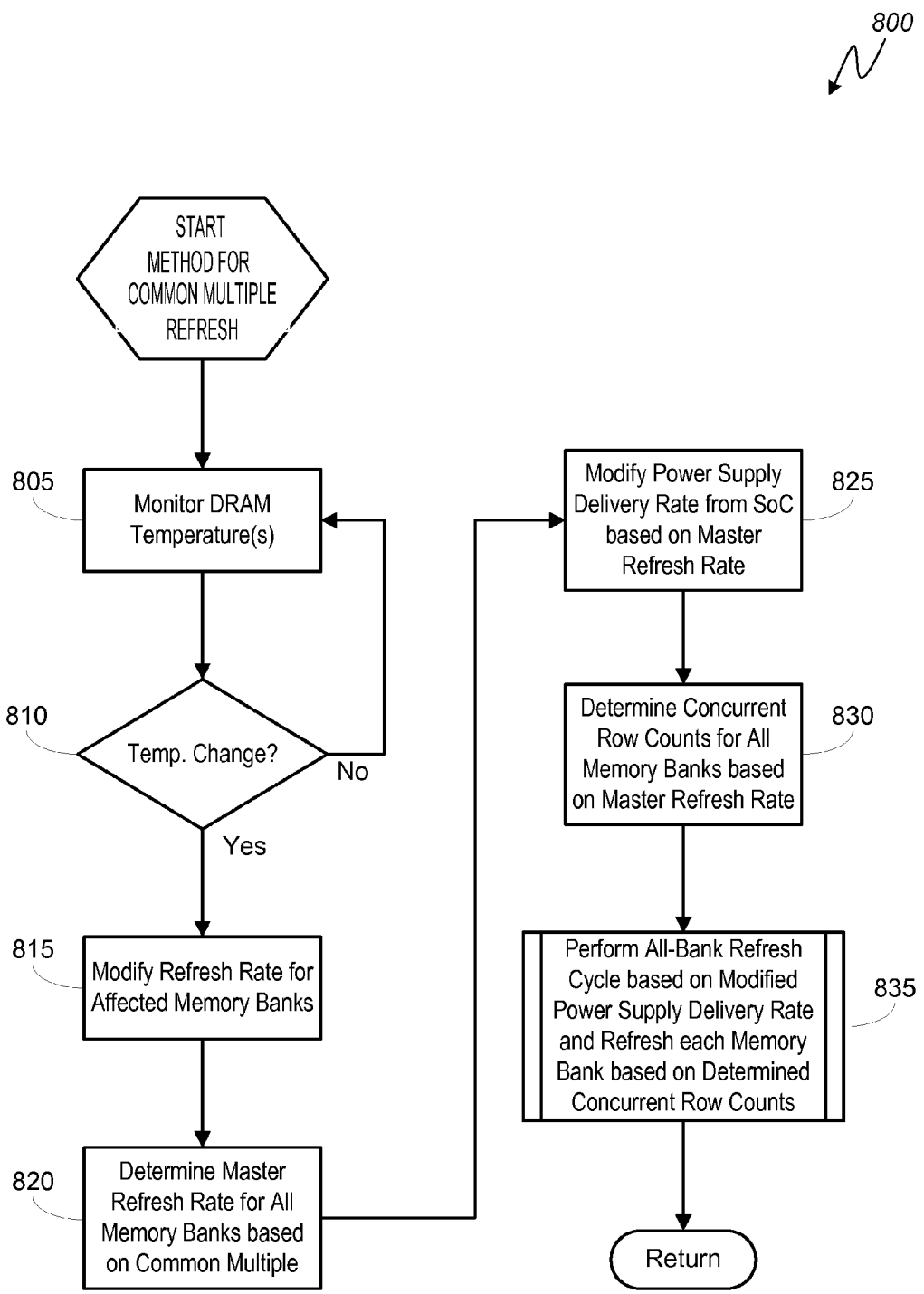
FIG. 8 is a logical flowchart illustrating an exemplary method for executing a common multiple refresh of a multi-bank DRAM according to an exemplary temperature compensated memory refresh ("TCMR") solution.

FIG. 8 is a logical flowchart illustrating an exemplary method for executing a common multiple refresh of a multi-bank DRAM according to an exemplary temperature compensated memory refresh ("TCMR") solution. Beginning at block 805, temperatures of the various banks of the DRAM may be monitored. As would be understood by one of ordinary skill in the art, the temperature associated with any given bank of DRAM may dictate a temperature scaling factor that drives a minimum refresh rate required in order for the bank to maintain the integrity of its stored data.

Returning to the method 800, at block 810 the monitor module 114 may determine whether there has been a temperature change associated with one or more of the DRAM banks. If there has been no temperature change, then the "no" branch is followed from decision block 810 back to block 805 and temperature monitoring continues. With no temperature change recognized, the TCMR module 202 may continue to apply a current TCMR approach without adjustment. If the monitor module 114 recognizes a change in temperature of one or more of the banks, the "yes" branch is followed to block 815 and the TCMR module 202 may modify refresh rates (i.e., temperature scaling factors) associated with one or more banks.

At block 820, the TCMR module 202 may determine a master refresh rate based on a common multiple of the required refresh rates for each bank (i.e., it may determine a temperature scaling factor that is an integer of all the temperature scaling factors of the various banks). Based on the master refresh rate, at block 825 of the method 800 the TCMR module 202 may modify the refresh power supply delivery rate coming from the SoC. Next, at block 830, using the master refresh rate, the TCMR module 202 may determine concurrent page or row counts that must be refreshed each cycle for each bank in order to maintain data integrity. Once the concurrent page count for each bank is determined by the TCMR module 202, the TCMR module 202 may proceed at routine block 835 to apply the refresh power supply on each cycle to the determined number of rows for each bank. In this way, the TCMR fundamental refresh method 800 may optimize refresh power supply delivery to each bank based on each bank's optimal temperature scaling factor. The method 800 returns.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example. Therefore, disclosure of a particular set of program code instructions or detailed hardware devices or software instruction and data structures is not considered necessary for an adequate understanding of how to make and use the invention. The inventive functionality of the claimed computer implemented processes is explained in more detail in the above description and in conjunction with the drawings, which may illustrate various process flows.

In one or more exemplary embodiments, the functions described may be implemented in hardware, software, firmware, or any combination thereof. If implemented in software, the functions may be stored on or transmitted as one or more instructions or code on a computer-readable device. Computer-readable devices include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Therefore, although selected aspects have been illustrated and described in detail, it will be understood that various substitutions and alterations may be made therein without departing from the spirit and scope of the present invention, as defined by the following claims.

What is claimed is:

1. A method for harmonic refresh of a multi-bank memory component in a system on a chip ("SoC"), the method comprising:
    monitoring temperature associated with the multi-bank memory component;
    determining that the temperature has changed over a period of time;
    based on the temperature, determining temperature scaling factors for each of the banks in the multi-bank memory component;
    based on a fastest temperature scaling factor of the determined temperature scaling factors, setting a refresh power supply delivery rate to the multi-bank memory component from the SoC; and
    providing a refresh power supply to each of the banks according to the determined temperature scaling factors, wherein one or more of the determined temperature scaling factors differs from the fastest temperature scaling factor used to set the refresh power supply delivery rate.

2. The method of claim 1, wherein providing a refresh power supply to each of the banks according to the determined scaling factors comprises skipping one or more banks on a given refresh power supply cycle.

3. The method of claim 1, wherein the multi-bank memory component is a dynamic random access memory ("DRAM") component.

4. The method of claim 1, wherein monitoring temperature associated with the multi-bank memory component comprises monitoring temperatures uniquely associated with each of the banks in the multi-bank memory component.

5. The method of claim 1, wherein monitoring temperature associated with the multi-bank memory component comprises monitoring a temperature associated with the multi-bank memory component and one or more temperatures associated with the SoC.

6. The method of claim 1, wherein the SoC is part of a portable computing device.

7. The method of claim 6, wherein the portable computing device comprises at least one of a mobile telephone, a personal digital assistant, a pager, a smartphone, a navigation device, and a hand-held computer with a wireless connection or link.

8. A system for harmonic refresh of a multi-bank memory component in a system on a chip ("SoC"), the method comprising:
    a memory refresh module located on the SoC and configured to deliver a refresh power supply to the multi-bank memory component according to a refresh power supply delivery rate; and
    a temperature compensated memory refresh ("TCMR") module located within a memory subsystem and configured to:
        monitor temperature associated with the multi-bank memory component;
        determine that the temperature has changed over a period of time;
        based on the temperature, determine temperature scaling factors for each of the banks in the multi-bank memory component;
        based on a fastest temperature scaling factor of the determined temperature scaling factors, instructing the memory refresh module located on the SoC to adjust a setpoint of the refresh power supply delivery rate; and
        provide the refresh power supply to each of the banks according to the determined temperature scaling factors, wherein one or more of the determined temperature scaling factors differs from the fastest temperature scaling factor used to adjust the setpoint of the refresh power supply delivery rate.

9. The system of claim 8, wherein providing a refresh power supply to each of the banks according to the determined scaling factors comprises skipping one or more banks on a given refresh power supply cycle.

10. The system of claim 8, wherein the multi-bank memory component is a dynamic random access memory ("DRAM") component.

11. The system of claim 8, wherein monitoring temperature associated with the multi-bank memory component comprises monitoring temperatures uniquely associated with each of the banks in the multi-bank memory component.

12. The system of claim 8, wherein monitoring temperature associated with the multi-bank memory component comprises monitoring a temperature associated with the multi-bank memory component and one or more temperatures associated with the SoC.

13. The method of claim 8, wherein the SoC is part of a portable computing device.

14. The method of claim 13, wherein the portable computing device comprises at least one of a mobile telephone, a personal digital assistant, a pager, a smartphone, a navigation device, and a hand-held computer with a wireless connection or link.

* * * * *